United States Patent
Mao et al.

(10) Patent No.: US 12,080,601 B2
(45) Date of Patent: Sep. 3, 2024

(54) PACKAGED SEMICONDUCTOR DEVICES AND METHODS THEREFOR

(71) Applicant: NXP B.V., Eindhoven (NL)

(72) Inventors: Kuan-Hsiang Mao, Kaohsiung (TW); Wen Hung Huang, Kaosiung (TW); Yufu Liu, Taoyuan (TW)

(73) Assignee: NXP B.V., Eindhoven (NL)

( * ) Notice: Subject to any disclaimer, the term of this patent is extended or adjusted under 35 U.S.C. 154(b) by 175 days.

(21) Appl. No.: 17/377,507

(22) Filed: Jul. 16, 2021

(65) Prior Publication Data

US 2023/0014470 A1    Jan. 19, 2023

(51) Int. Cl.
   *H01L 23/31*   (2006.01)
   *H01L 21/56*   (2006.01)
   *H01L 21/78*   (2006.01)
   *H01L 23/00*   (2006.01)

(52) U.S. Cl.
   CPC ............ *H01L 21/78* (2013.01); *H01L 21/561* (2013.01); *H01L 23/3185* (2013.01); *H01L 24/13* (2013.01); *H01L 24/20* (2013.01); *H01L 2224/13024* (2013.01); *H01L 2224/214* (2013.01); *H01L 2924/18162* (2013.01)

(58) Field of Classification Search
   None
   See application file for complete search history.

(56) References Cited

U.S. PATENT DOCUMENTS

| | | | |
|---|---|---|---|
| 8,922,021 B2 | 12/2014 | Scanlan | |
| 9,196,537 B2 | 11/2015 | Van Gemert et al. | |
| 2008/0316714 A1* | 12/2008 | Eichelberger | H05K 1/0218 361/728 |
| 2009/0011543 A1 | 1/2009 | Karta et al. | |
| 2009/0243097 A1* | 10/2009 | Koroku | H01L 23/3114 257/737 |
| 2013/0119533 A1* | 5/2013 | Chen | H01L 25/0652 257/737 |
| 2015/0318229 A1 | 11/2015 | Xu et al. | |
| 2016/0141218 A1* | 5/2016 | Horibe | H01L 24/94 257/737 |

\* cited by examiner

Primary Examiner — Jay C Chang

(57) ABSTRACT

Packaged semiconductor devices are disclosed, comprising: a semiconductor die having a top major surface with a plurality of contact pads thereon, and four sides, wherein the sides are stepped such that a lower portion of each side extends laterally beyond a respective upper portion; encapsulating material encapsulating the top major surface and the upper portion of each of the sides wherein the semiconductor die is exposed at the lower portion of each of the sides; a contact-redistribution structure on the encapsulating material over the top major surface of the semiconductor die; a plurality of metallic studs extending through the encapsulating material, and providing electrical contact between the contact pads and the contact-redistribution structure. Corresponding methods are also disclosed.

11 Claims, 6 Drawing Sheets

PACKAGED SEMICONDUCTOR DEVICES AND METHODS THEREFOR

FIELD

The present disclosure relates to package semiconductor die and to methods of making such packaged semiconductor die.

BACKGROUND

A wide range of technologies and processes are used in modern semiconductor device packaging. One group of such technologies is referred to wafer level packaging, and a subgroup of these technologies is referred to as wafer level, chip scale packaging (WLCSP). These technologies may be combined with so-called "bump bonding" or "flip-chip" bonding in which the packaged device is provided with a plurality of balls or bumps on one surface, which are used to provide electrical connections between the packaged device and a printed circuit board.

One group of wafer level chip scale packaging technologies includes both so-called "fan out" and "fan in" packaging. In these technologies, the balls or bumps are not directly contacted to the surface of the semiconductor die. Instead, the die is encapsulated in a moulding compound, and a so-called "redistribution layer" or redistribution structure is deposited on top of the moulding compound. The redistribution layer or redistribution structure includes conducting tracks which make electrical contact to contact pads on the surface of the semiconductor die via metal studs, typically of copper, through the moulding compound, and in turn the balls or bumps are deposited on and in electrical contract with the tracks of the redistribution layer or redistribution structure.

However, some process steps introduce problems and challenges which may impact the process efficiency or yield. It would therefore be desirable to provide a method for packaging semiconductor die with bump bonding which improves process efficiency and allows for higher yield.

BRIEF DESCRIPTION OF DRAWINGS

Embodiments will be described, by way of example only, with reference to the drawings, in which.

Figure 1:
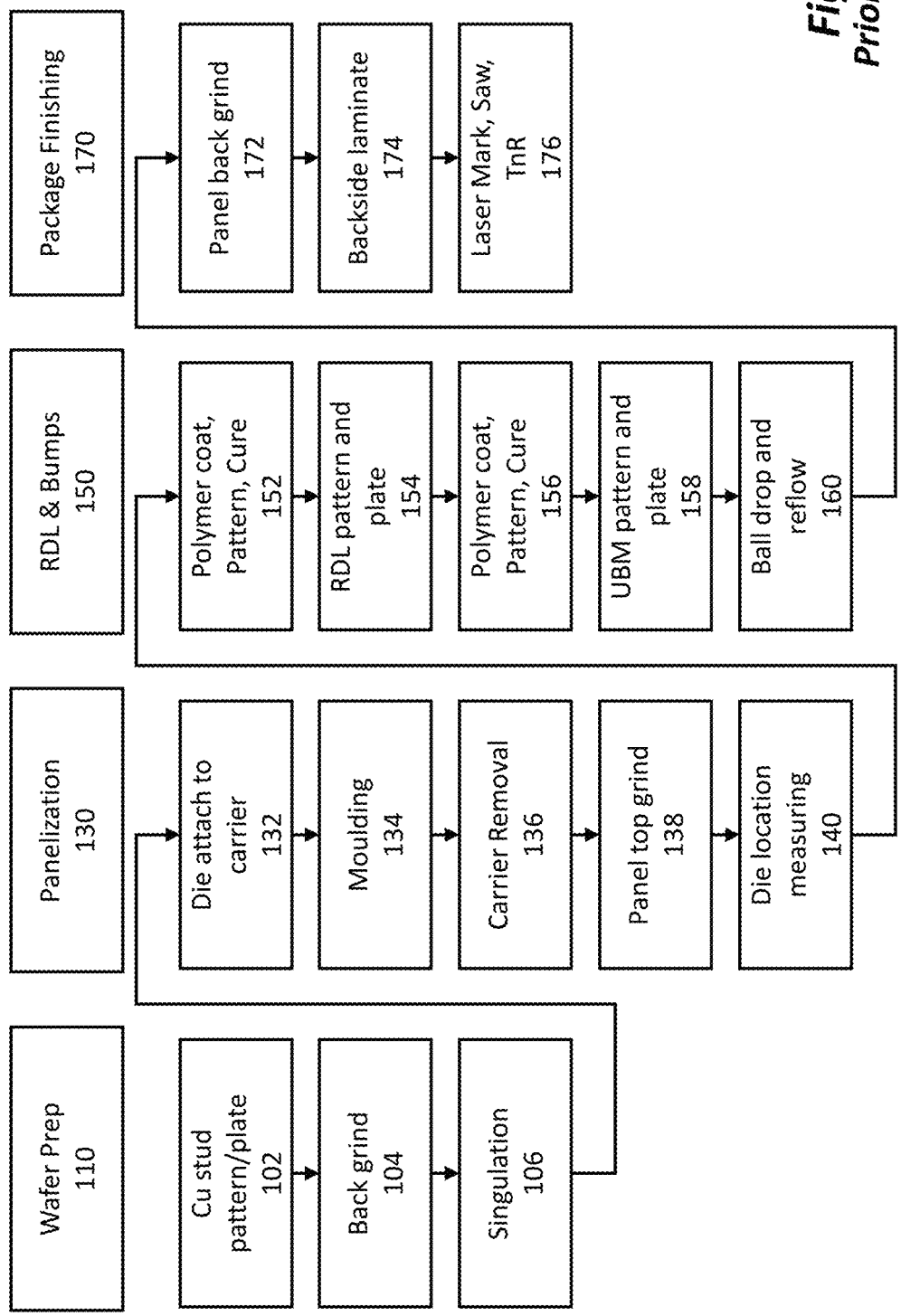
FIG. 1 shows a process flow for a known method of wafer level chip scale packaging.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

FIG. 1 shows a summary flowchart for a known such process, which in this case is a fan out process, or copper stud chip face up fan-out structure, also known as "M-series Technology". The process includes four general stages: firstly, wafer prep 110, followed by panelization 130, then by "RDL and bumps" 150 and finally package finishing 170. Within the wafer prep stage at 102 ("copper stud pattern and plate"), a plurality of metallic studs typically of copper are deposited onto the top of the semiconductor wafer providing electrical contact to contact pads on the wafer. The wafer is then thinned by a backgrinding process 104 ("back grind"), and singulated into individual die at 106 ("singulation").

The second stage is generally referred to as panelization 130. In a first step within this stage, the die are attached to a carrier at 132 ("die attach to carrier"). The carrier may take the shape, typically rectangular, of a panel or may correspond to an original wafer shape and/or size. It should be mentioned that the die are more spaced apart in the panel than they are in the original wafer. Next, moulding compound is applied in a moulding stage 134 ("moulding") to encapsulate the die. The carrier is then removed at 136 ("carrier removal"), and the front side of the panel, comprising encapsulating moulding compound with die embedded therein, is ground at step 138 ("Panel top grind"), to expose the top face of the metal studs. Typically, the positioning of the die is then measured, checked or confirmed in an automated visual inspection step labelled as 140 ("die location measuring").

The third stage may generally be referred to as RDL and Bumps 150. In this stage, a further polymer coat or coating is deposited over the panel, patterned and cured at 152 ("polymer coat, pattern, cure"). The patterning exposes the top of the copper studs. A patterned metallic redistribution layer ("RDL") is then deposited, in step 154 ("RDL pattern and plate"). Next, a yet further polymer coat is deposited over the panel, patterned and cured at 156 ("polymer coat, pattern, cure"). The polymer coat applied at 152, RDL applied at 154 and yet further polymer coat applied at 156 may together described as a "redistribution structure". The next step comprises preparing for the balls or bumps, at step 158 ("Under-Bump Metallisation, (UBM) pattern and plate"). Finally in the stage, the balls or bumps are deposited onto exposed parts of the RDL at 160 ("ball drop and reflow").

The fourth stage may generally be referred to as package finishing 170. In this stage, the back surface of the panel is ground to further thin it at 172 ("panel back grind"). The backside of the panel is then typically laminated in order to provide protection to the sixth (bottom) face of each die at 174 ("backside laminate"). Finally, the die are laser marked to identify individual die, and separated by being cut— typically using a saw—through the encapsulation between the spaced-apart die, and "Tape and Reel" is performed at 176 ("laser marked, saw, TnR"). TnR generally refers to a chip sorting process stage in which involves mechanical handling and movement to pick up individual singulated die, and place them onto a tape reel This type of packaging process provides protection to the semiconductor die on at least five faces (the top face and the five edges), since these are all encapsulated in moulding compound. In addition, if step 134 is included, the sixth face is also protected. However, as is evident from the above description there are many process steps involved. In addition some of these process steps introduce problems and challenges which may impact the process efficiency or yield: for instance, by separating the wafer into individual die and spacing the die out before positioning them onto a carrier, the rigidity of the structure is potentially reduced (particularly once the panel is removed from the carrier) which can result in warpage. In addition, the die have to be carefully located on the carrier in order to avoid placement errors.

According to a first aspect of the present disclosure, there is provided a packaged semiconductor device, comprising: a semiconductor die having a top major surface with a plurality of contact pads thereon, and four sides, wherein the sides are stepped such that a lower portion of each side extends laterally beyond a respective upper portion; encapsulating material encapsulating the top major surface and the upper portion of each of the sides wherein the semiconductor die is exposed at the lower portion of each of the sides; a contact-redistribution structure on the encapsulating material over the top major surface of the semiconductor die; a plurality of metallic studs extending through the encapsulating material, and providing electrical contact between the contact pads and the contact-redistribution structure. The stepped nature of the sides of the die, with the exposed part of the semiconductor die in the lower part only, may provide for effective 5-side protection, as the encapsulating material may encapsulate not only the top surface of the die but the upper portions of the sides of the device, leaving only a—typically relatively small—lower portion of the semiconductor device exposed. At the same time, the encapsulant over the top of the semiconductor die provides a surface on which is formed a contact-redistribution structure, such that balls or bumps can be positioned for optimal routing of electric signals in the PCB when the device is mounted.

In one or more embodiments, the contact redistribution structure extends laterally beyond the semiconductor die. In one or more embodiments wherein at least one contact ball is positioned laterally beyond the semiconductor die. This may provide for a degree of fanout of the balls.

In one or more embodiments, the device further comprises a plurality of contact balls, on the redistribution structure and at least some of which in electrical contact with one or more of the contact pads through the contact-distribution structure. By spacing the contact balls away from the semiconductor die top or major surface, improved mechanical properties may result, which in turn may be beneficial for instance in use or during electrically attaching the device to a PCB.

In one or more embodiments, the plurality of contact balls are arranged such that at least one of the contact balls is positioned laterally further from a centre of the semiconductor die than a respective contact pad to which it is electrically connected. The encapsulating material may act to provide protection to the otherwise potentially vulnerable perimeter of the semiconductor device die, and thus provide more flexibility in the location positioning of the contact balls.

In one or more embodiments, a depth (t1) of the encapsulating material between the contact redistribution structure and the interface with the exposed semiconductor die is within a range between 50% and 90% of a depth (t2) of the packaged semiconductor device. Providing a depth t2 of the device which is smaller than t1 may enhance the protection of the side faces.

In one or more embodiments, the lower portion of each side of the semiconductor die extends laterally beyond the respective upper portion by a distance which is within a range between about 10 µm and about 20 µm. Although this distance is relatively small, it may be sufficient, when filled with encapsulant, to protect the upper portion of the sides. On the other hand, the distance is sufficiently small that the amounts of semiconductor "real estate" or area which is thereby sacrificed (by being removed and thus not available for circuit layout) does not introduce too severe a cost penalty.

In one or more embodiments, the packaged semiconductor device may further comprise further encapsulating material encapsulating a lower major surface of the semiconductor die. In other embodiments, the lower major surface of the semiconductor die may be protected by a laminate. The metallic studs may comprise copper. In other embodiments, alternative metals or materials may be used.

In one or more embodiments, the encapsulating material is a moulding compound, which may be an epoxy moulding compound.

According to a second aspect of the present disclosure, there is provided a method of manufacturing a plurality of packaged semiconductor devices, the method comprising: processing a wafer to produce a plurality of semiconductor die each having contact pads on a top major surface thereof, and having sawlanes therebetween; cutting through a part of a thickness of the wafer in the sawlanes to expose upper portions of each side of the die, the upper portions of neighbouring die being separated by a first cutting width; encapsulating the top major surface and upper portions of the sides of each die with an encapsulating material; providing a plurality of metallic studs, at least some of which are in electrical contact with respective contact pad and extending through the encapsulating material; providing a contact redistribution structure over the encapsulating material, extending laterally into the sawlanes and in electrical contact with the contact pads through the metallic studs; and separating the plurality of packaged semiconductor devices by cutting, with a second cutting width, through the encapsulating material and the remainder of the thickness of the wafer, wherein the second width is less than the first width.

In one or more embodiments, the second width may be less than the first width by between 20 µm and 40 µm.

The method may further comprise providing a plurality of contact balls, on the redistribution structure and at least some of which are in electrical contact with one of more contact pads through the contact-distribution structure.

The method may further comprise arranging the plurality of contact balls such that at least one of the contact balls is positioned laterally further from a centre of the semiconductor die than a contact pad to which is it electrically connected.

The method may further comprise arranging the plurality of contact balls such that at least some of the contact balls are positioned laterally at least partly in the sawlanes.

The method may further comprise, after encapsulating the top major surface and upper portions of the sides of each and before separating the plurality of packaged semiconductor devices, grinding a bottom major surface of the semiconductor to reduce the thickness of the semiconductor wafer.

Cutting may be a one of sawing and laser-cutting.

Figure 2:
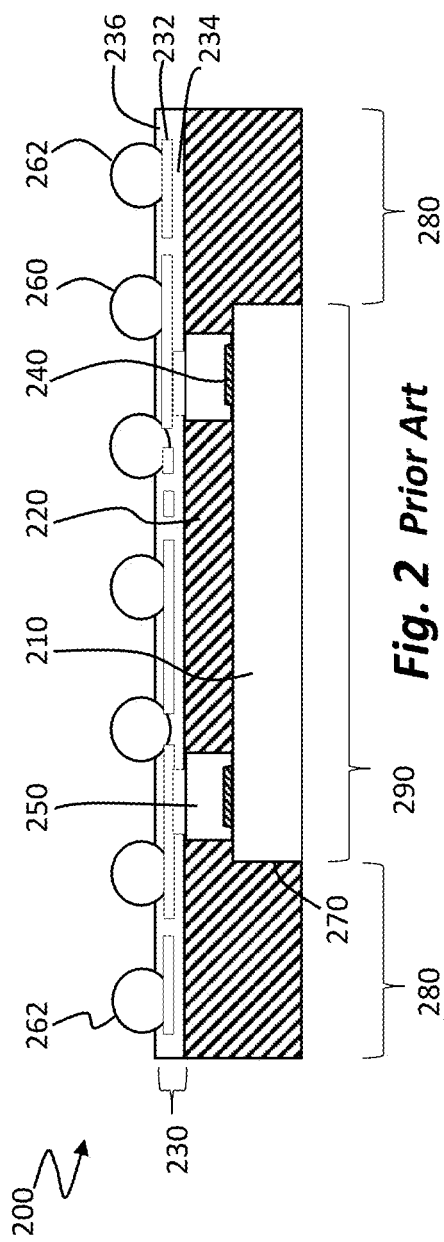
FIG. 2 shows a schematic cross-section through a known packaged semiconductor device.
Figure 3:
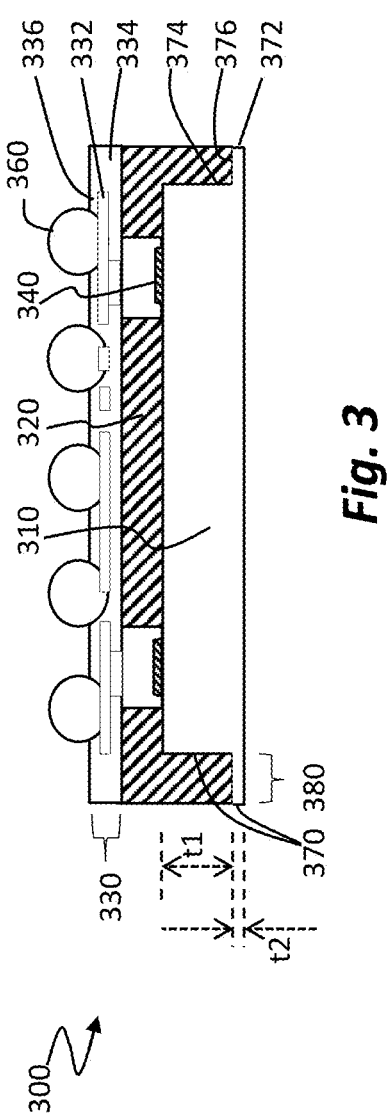
FIG. 3 shows a schematic cross-section through an example packaged semiconductor device according to one or more embodiments.

Returning now to the drawings, FIG. 2 shows a schematic cross-section through a known packaged semiconductor device 200; whilst FIG. 3 shows a schematic cross-section through a packaged semiconductor device 300 according to one or more embodiments. The figures will be described together, in order to assist in identifying distinguishing features of embodiments according to the present disclosure. FIGS. 2 and 3 each show a semiconductor die 210 and 310 respectively, encapsulated in moulding compound 220 and 320 respectively. Over the moulding compound is a redistribution structure 230 and 330 respectively. The redistribution structure comprises a redistribution layer 232, 332 respectively and an insulating layer 234 and 334 respectively thereunder and a further insulating layer 236 and 336 respectively thereover. The insulating layers may comprise moulding or encapsulating material. The semiconductor die or chip includes contact pads 240 and 340 which are in electrical contact with the redistribution layer through metallic studs or plugs 250 and 350 respectively. The redistribution structure together with the contact pads may be referred to as a contact-redistribution structure. Finally, balls or bumps 260 and 360 respectively are located on the top of the semiconductor device and affixed in electrical contact with the redistribution layer.

As shown in FIG. 2 the known packaged semiconductor device 200 is significantly larger than the semiconductor die 210 due to a large volume of encapsulant which both protects the side faces 270 and extends some distance therefrom. As shown the encapsulant may extend beyond the die 210 by a width 280. The width 280 of the encapsulant on each side of the die may be, for a typical known process, of the same order of magnitude as a width 290 of the die itself. Thus, for a typical die which is 5 mm×5 mm, the finished semiconductor package may have dimensions from about 5.25 mm×5.25 mm to as large as 10 mm×10 mm.

Turning now in more detail to the packaged semiconductor device 300 according to embodiments of the present disclosure, the semiconductor die 310 has sides 370, or faces, which include a step therein. That is to say, a lower portion 372 of each side extends laterally beyond a respective upper portion 374. As will be explained in more detail hereinbelow, the stepped sides result from a two-stage cutting process: in a first "partial cut", a cut is made into the wafer in the saw-lane between the semiconductor die; however the cut does not completely separate or singulate the individual die, but only cuts a part of the way through the die, leaving a bottom surface of the cut, which can be seen at 376. The partial cut may also be referred to as a "half cut", although it will be appreciated that in the presence disclosure, the term "half"" is to be interpreted broadly and is not limited to a value at or close to 50%. Later in the process, the packaged devices are singulated using another cut, this time through encapsulating material which fills the original partial cut, and completely through remaining thickness of the wafer. The upper portion 374 is thus a result, or sidewall, of the first "partial cut"; the lower portion 372 of the side is the result, or sidewall, of the second, singulation cut. Again as will be described in more detail hereinbelow, the cuts may be made by known techniques such as sawing or laser cutting.

As a result of the two-stage cutting process, the encapsulating material 320 which encapsulates the top major surface does not encapsulate the entirety of the sides of the device. Rather it encapsulates the upper portion 374 of each of the sides; the semiconductor die is exposed at the lower portion 372 of each of the sides or side faces. The width 380 of the encapsulating material which extends beyond the semiconductor die is then defined by the difference between the width of the first cut (the partial cut) and the second, singulation cut. In order to limit the wasted material from the wafer, this difference is typically limited to values of the order of 40 µm or less. The width 380, which is half this difference, thus typically has a value of between 10 and 20 µm.

A feature of the known "fan-out" process resulting in the known semiconductor device 200 is that the larger surface of the package device, relative to that of the semiconductor die, allows the bumps or balls 260 to be more widely spaced than would be the case were they directly contacted to the die itself. For example, as shown in FIG. 2, one or more of the outermost bumps or balls 262 may be positioned over the part of the encapsulating material which extends beyond the die.

The packaged semiconductor device 300 according to the present disclosure benefits from this feature, but to a significantly reduced amount, due to the above-mentioned constraints on the width 380. Nonetheless, it may be possible to distribute the balls 360 slightly more widely than would be the case if the balls were contacting the semiconductor die itself (for instance the encapsulating material 320 protects the perimeter of the die such that a ball on the redistribution layer may be located closer to the perimeter than would be the case if the ball was directly contacted to the semiconductor die, without damaging, such as cracking, the edge of the die).

Figure 4:
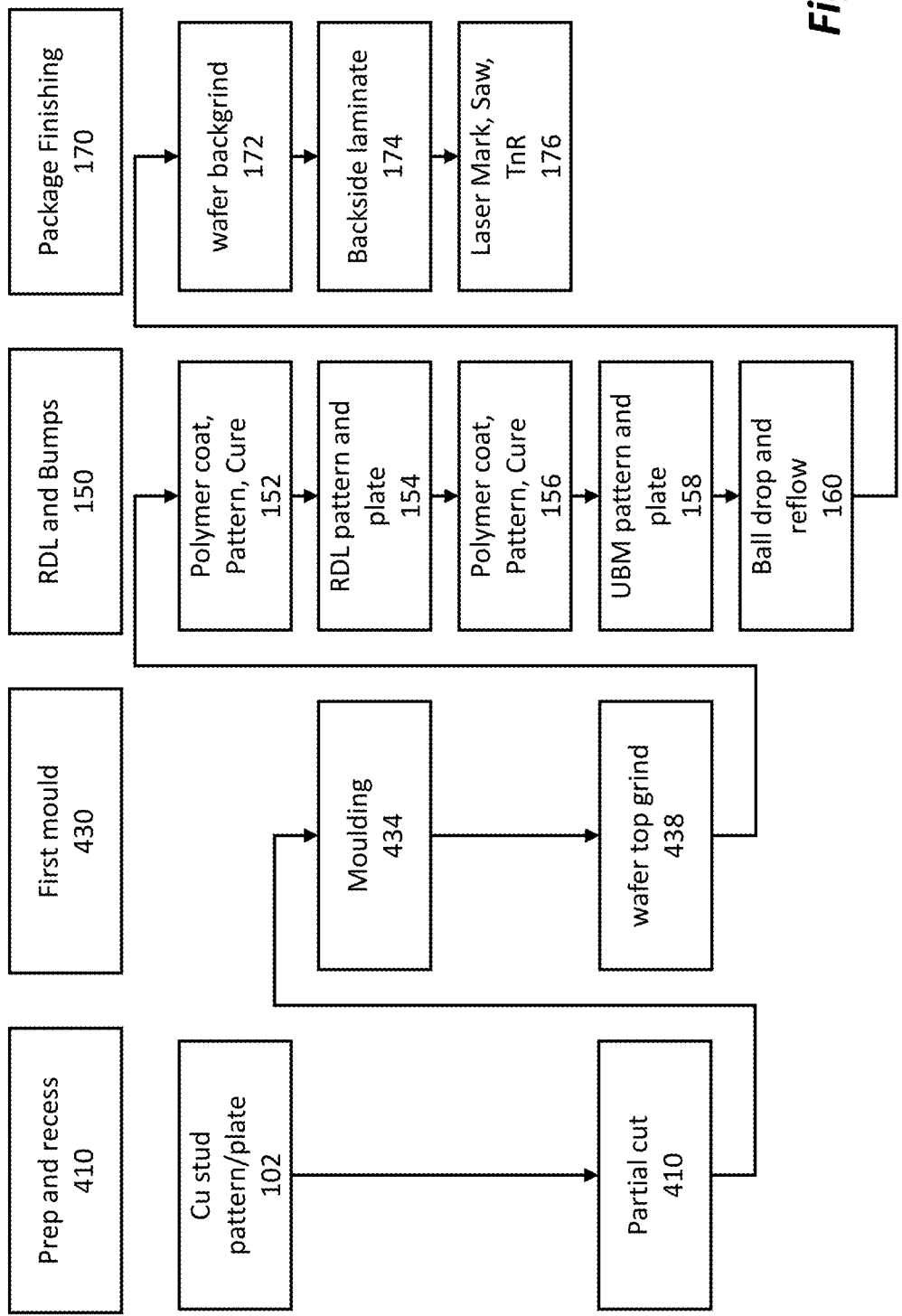
FIG. 4 shows the corresponding process flow to that in FIG. 1, but for embodiments according to the present disclosure.

Turning now to FIG. 4, this shows an example process flow according to embodiments of the disclosure. This figure has been arranged for direct comparison with the known process flows shown in FIG. 1 from which it is immediately apparent that the process flow according to embodiments is significantly simpler than the known process flow. In particular, there is no requirement for a separate panelization stage 130. Although in this figure the process has been separated into four stages, the separation and distinction between the stages is to some extent artificial but shown for comparison with the known process of FIG. 1.

In comparison with the wafer preparation stage 110 shown in FIG. 1, the first stage in FIG. 4 may be described as "prep and recess" 410; furthermore, in comparison with the panalisation stage 130 shown in FIG. 1, the second stage in FIG. 4 may be summarised as a "first mould stage" 430. The third and fourth stage ("RDL and bumps" 150) and ("package finishing" 170) are similar to those in the known processes.

Within the prep and recess stage, at 102 ("copper stud pattern and plate") a plurality of metallic studs, typically of copper, are deposited onto the top surface of the semiconductor wafer providing electrical contact to contact pads on the wafer similar to the known process. Although the metallic studs are typically of copper, other metals or a combination of materials may be used. In particular, copper may be applied for most of the thickness of the start, but the top part of the stud may comprise a different and typically a softer metal in order to facilitate planarization.

In contrast to the known process, the individual die are not singulated at this stage. There is thus no need to perform a backgrinding process 104 in this stage, since the wafer remains intact and can be thinned by backside grinding at a wafer scale, at a later stage of the overall process. Rather, once the copper studs have been formed, the wafer is exposed to a first cutting process ("Partial cut" 406). The wafer is cut by means of a sawing or dicing tool according to known processes, but the cut extends only through a part of the thickness of the device thickness leaving the wafer intact with a group of parallel recesses formed by the saw lines. The first cut may extend through a sufficient depth, t1, of the wafer such that the upper portion of the side of the final device comprises at least 50%, and typically up to 80 to 90% of the thickness of the final device. This may provide that the final device is protected on most of its four sides by encapsulant, since, as will be described below, the backside of the wafer is later thinned, thus reducing the thickness (e.g., t2 in the final device) of the lower portion of the side, relative to the uncut thickness at this stage of the process.

Comparing the process flow shown in FIG. 4 with that of FIG. 1, it can be seen that, in embodiments of the present disclosure, no panel isolation is required. Thus the "second" stage of the four-stage process has fewer process steps than the known process.

According to embodiments, moulding compound is applied in a moulding stage 434 ("moulding") to partially encapsulate the die. The moulding compound is applied to the topside of the wafer, and extends into the recesses formed by the first cut. Thereby, the moulding compound protects, or encapsulates, the top surface, and the upper part of the sides of each individual die within the wafer. The front side of the wafer, comprising encapsulating moulding compound with die embedded therein, is then ground at step 438 ("wafer top grind"), to expose the top face of the metal studs. Since the die are still on the integral wafer, embodiments according to the present disclosure do not require, at this stage, an automated visual inspection step.

The third stage "RDL and Bumps" 450, is generally the same as the known process, although it will be appreciated that these process steps are applied to the die on an integral wafer including partial cuts therein, rather than to a aggregation of multiple separates die held in position by encapsulating compound. Even after the partial cuts, the wafer has significantly better mechanical and handling properties than the matrix of moulding compound with die embedded therein of the known process. For example, its thermal strain properties may be easier to accommodate, it may have better planarization, the alignments and orientation of the die may be more accurately known, etc.

In a first step, a further polymer, or other insulating material, coat is deposited over the panel, patterned and cured at 152 ("polymer coat, pattern, cure"). The patterning exposes the top of the copper studs. A patterned metallic redistribution layer ("RDL") is then deposited, in step 154 ("RDL pattern and plate"). Next, a yet further polymer, or other insulating material, coat is deposited over the panel, patterned and cured at 156 ("polymer coat, pattern, cure"). The polymer coat supplied at 152, RDL applied at 154 and yet further polymer coat applied at 156 may together described as a "redistribution structure". The next step comprises preparing for the balls or bumps, at step 158 ("Under-Bump Metallisation, (UBM) pattern and plate"). Finally in the stage, the balls or bumps are deposited onto exposed parts of the RDL at 160 ("ball drop and reflow").

The fourth stage may generally be referred to as package finishing 470, and again is similar to that for the known process, except that these steps are once again applied to an integral wafer rather than a reconstituted group of die embedded in a moulding compound matrix. In this stage, the back surface of the panel is ground to further thin it at 172 ("panel back grind"). The backside of the panel is then typically laminated in order to provide protection to the sixth (bottom) face of each die at 174 ("backside laminate").

Finally, the die are laser marked to identify individual die, and separated by being cut—typically using a saw—through the encapsulation in the saw lanes or recesses produced by the first partial cuts, and then through the remainder of the thickness of the wafer. This is shown at process page 476 "laser mark, saw, TnR".

Figure 5:
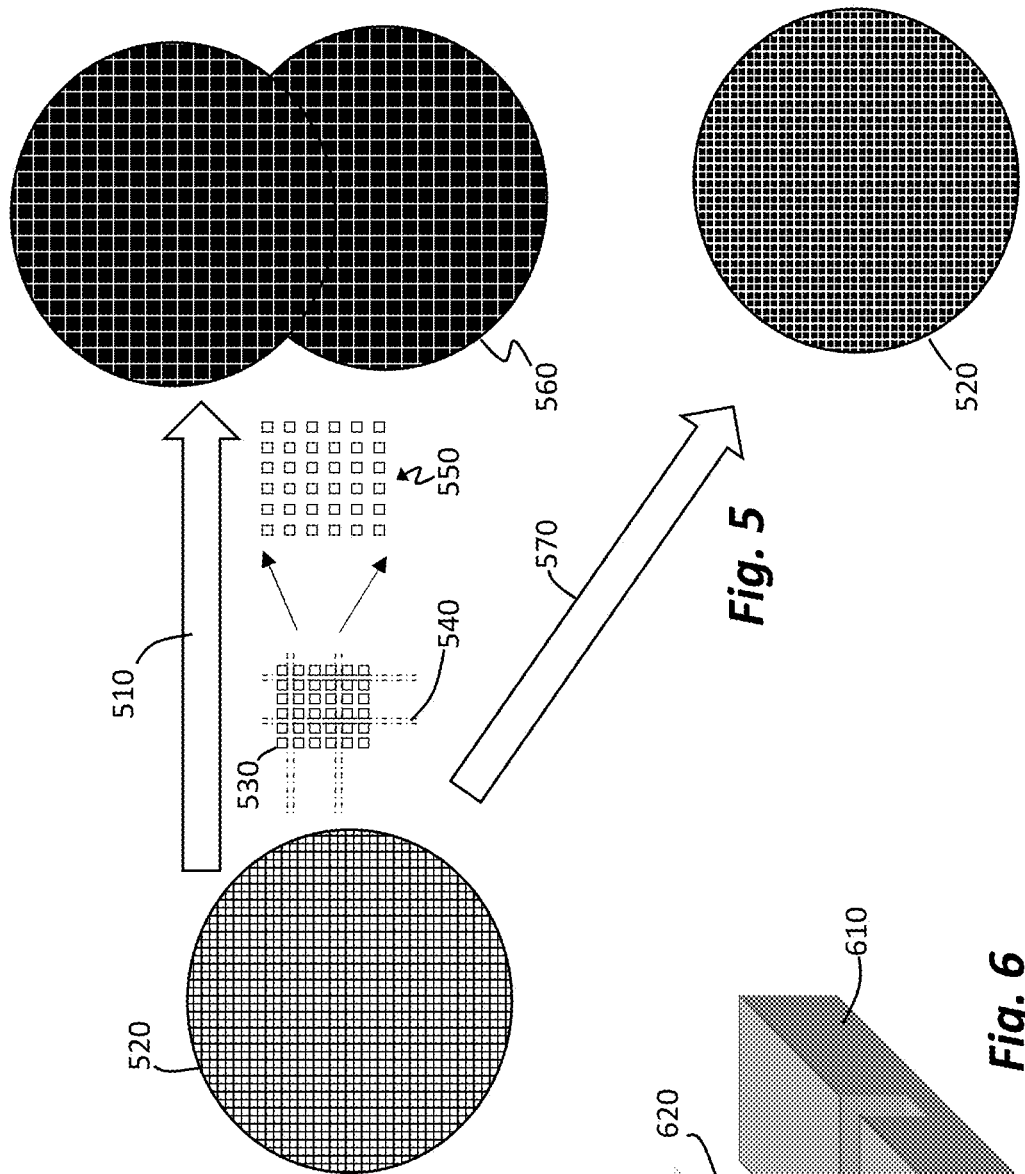
FIG. 5 shows schematically the reduction in the process complexity which may be achieved according to embodiments.

As can be seen in FIG. 1 and FIG. 4, a process according to embodiments of the present disclosure may have fewer process steps than the known processes. This is illustrated schematically in FIG. 5. According to the conventional known process 510, the wafer 520 which comprises a plurality of die 530 with saw lanes 540 therebetween is cut into separate die, which are then relocated on a carrier and in particular are spaced further apart, as shown pictorially at 550. Because the die are not packed so densely on the carrier, a single wafer 520 may be reconstituted as several carriers (of the same shape and size), as shown pictorially at 560. Alternatively, the die may be positioned onto a single, larger, panel. In contrast, according to present embodiments the wafer is used directly, with the die in their original configuration, as shown at 570

Figure 6:
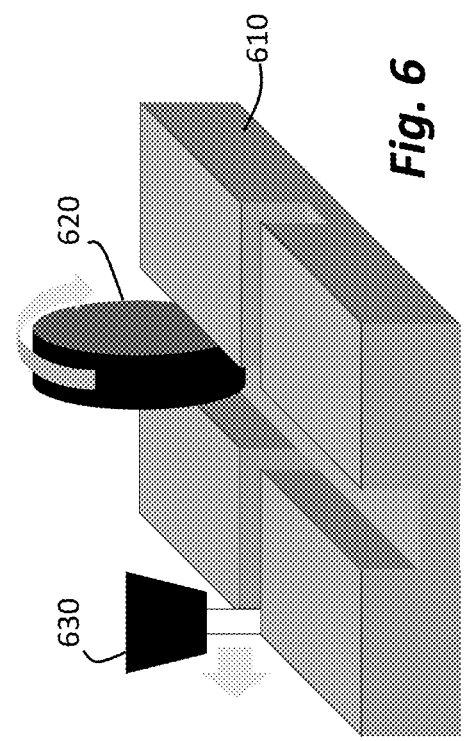
FIG. 6 shows, pictorially, the partial cut process according to embodiments.

FIG. 6 shows, schematically, two possible processes for the partial cut process step on a wafer 610. It should be noted that these are nonlimiting examples. According to one or more embodiments, the partial cut process is provided using a semiconductor saw, having a mechanical blade, as shown at 620. As will be familiar to the skilled person, saw cuts of semiconductor wafers using a mechanical blade typically result in a kerf loss, that is to say a width of removed material, in the range of 30 to 80 µm. Saw-cut width for less advanced, i.e. larger, technology process nodes such as greater than 90 nm (so-called "non low-K" wafers), are typically nominally 40 µm and thus result in kerf losses between approximately 38 and 43 µm. For advanced, i.e. smaller, nodes, such as <90 nm, (known as "low-K") wafers, laser grooving is generally preferred, in which the groove may typically be about 60 µm nominal thickness, resulting in kerf losses between approximately 57 to 63 µm (for a 60 µm groove). Laser grooving tolerances and cut thicknesses are similar to saw cut thicknesses. It should be noted though that the depth of cut may be harder to control using laser grooving.

Figure 7:
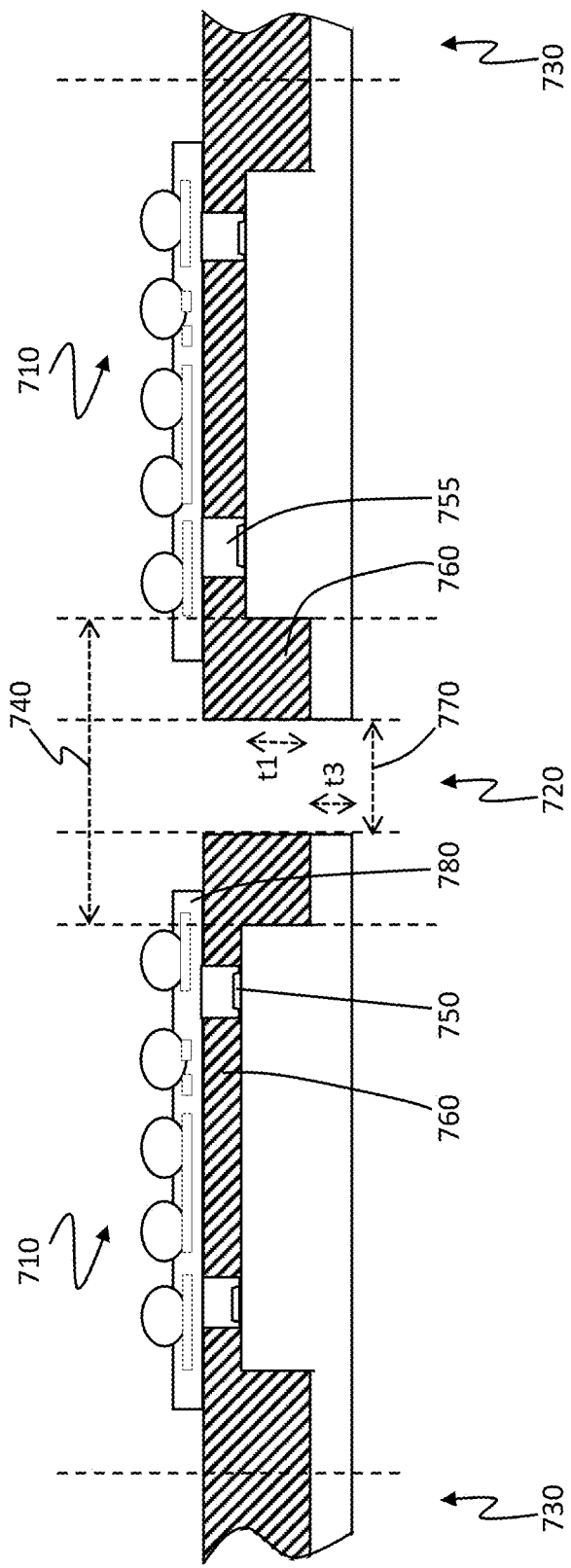
FIG. 7 shows a schematic cross-section through two encapsulated die sites on a wafer partway through the process according to embodiments of the disclosure.

Turning now to FIG. 7, this shows, schematically, two encapsulated die sites 710 on a wafer partway through the process after a first singulation cut 720 has been made between the die (but prior to other singulation cuts, such that the wafer and encapsulant is still showing in the locations 730 at which those other cuts would take place at a later stage). As can be seen from the figure, during a first cut which is the partial cut 740, the wafer is recessed by a thickness t1. The thickness t1 may be process dependent, but for typical 8 inch to 12 inch semiconductor wafers, with thicknesses between 625 µm and 725 µm, t1 may typically be between 200 and 400 µm and may be nominally 300 µm. That is to say, the partial cuts may typically extend to a depth between one third and two thirds of the nominal wafer thickness, and may in a particular example have a nominal depth of half the nominal wafer thickness.

As already mentioned above, the width of material removed, shown at 740, may typically be between 57 and 63 µm for a 60 micro nominal blade thickness. Other widths may be possible (for example for a 100 µm nominal blade thickness the width of removed material may be between 97 and 103 µm). However, the skilled person will appreciate that the thicker the width of removed material, the fewer gross die per wafer is achievable, so generally the width of the partial cut will not exceed that corresponding to a 60 µm nominal blade thickness. The skilled person will also appreciate that the "saw lane" width to accommodate the partial cuts will be wider than the actual partial cut, to allow for positioning tolerance of the saw blade or laser grooving tool. Furthermore, it will be recognised that the outermost contact pads 750 on the wafer and studs 755 through the encapsulated moulding compound 760 will be positioned, as shown, at some distance from the cuts edge of the die, and not right up to the perimeter.

FIG. 7 also shows the width 770 of the singulation cut, which cuts through the encapsulating moulding compound and the remainder of the thickness of the die. A thickness t3 of the lower portion of the die is shown in FIG. 7. After backside grinding, the lower portion of the die will in general have a reduced thickness such as t2 (shown in FIG. 3). As shown in FIG. 7, the redistribution layer or redistribution structure 780 may extend beyond the partial cut edge of the individual die, or may be (not shown) located only above the die itself. It will be appreciated that FIG. 7 is a schematic only such that the width of the die, which is typically of the order of a few millimetres and may be for example 5 mm, is not shown in proportion to the width of the partial cut or the singulation cut.

Figure 8:
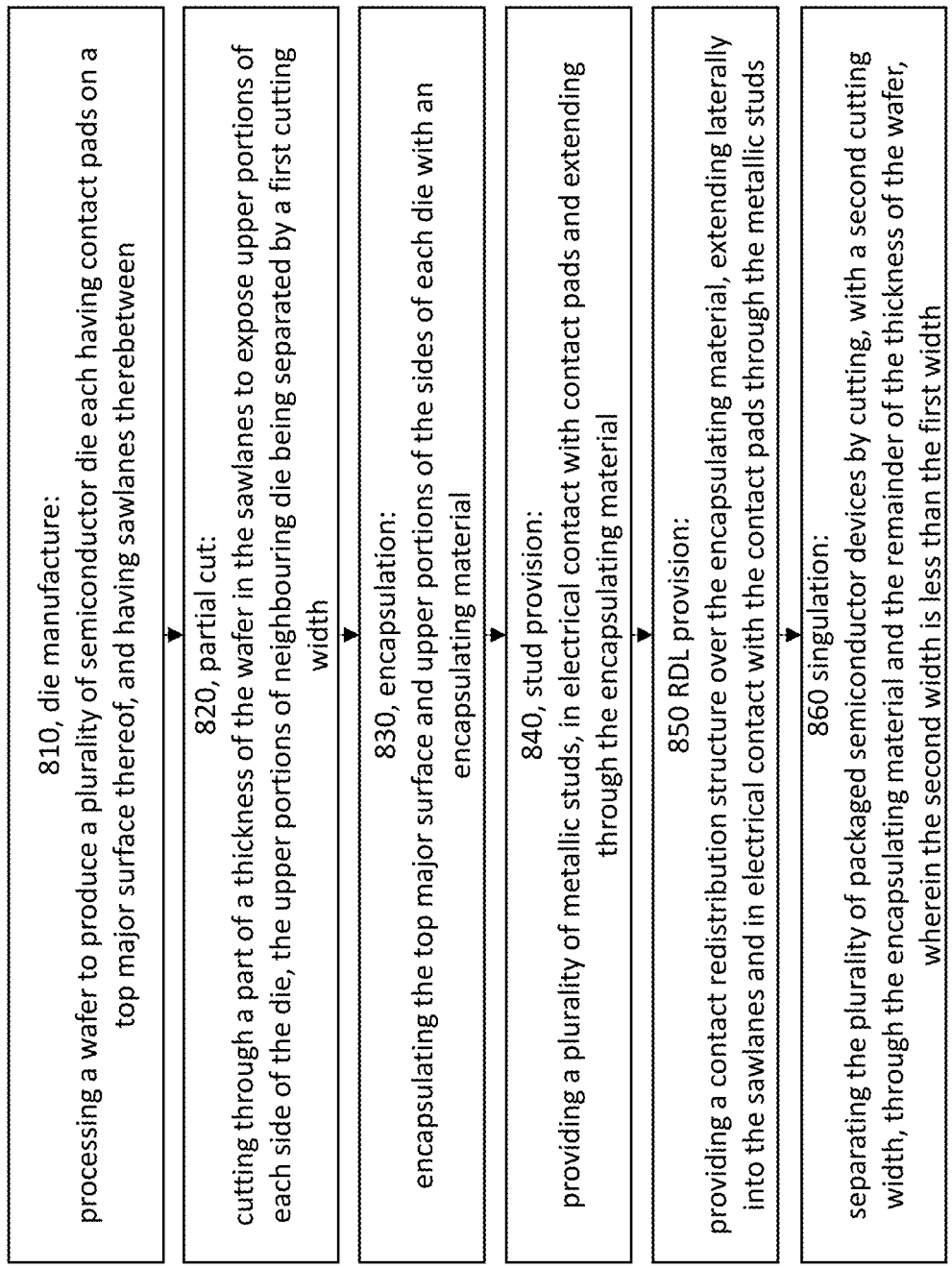
FIG. 8 shows a flowchart of a process according to embodiments of the disclosure.

FIG. 8 shows a flow diagram of a method of manufacturing a plurality of packaged semiconductor devices according to one or more embodiments of the present disclosure.

The figure shows, at 810, die manufacture, which comprise processing a wafer to produce a plurality of semiconductor die each having contact pads on a top major surface thereof, and having sawlanes therebetween.

At 820 is shown the partial cut, which comprises cutting through a part of a thickness of the wafer in the sawlanes to expose upper portions of each side of the die, the upper portions of neighbouring die being separated by a first cutting width.

At 830 is shown encapsulation, which comprises encapsulating the top major surface and upper portions of the sides of each die with an encapsulating material.

At 840 is shown stud provision, which comprises providing a plurality of metallic studs, some or each of which are in electrical contact with one or more contact pads and which extend through the encapsulating material.

At 850 is shown RDL provision, which comprises providing a contact redistribution structure over the encapsulating material, extending laterally into the sawlanes and in electrical contact with the contact pads through the metallic studs.

At 860 is shown singulation, which comprises separating the plurality of packaged semiconductor devices by cutting, with a second cutting width, through the encapsulating material and the remainder of the thickness of the wafer, wherein the second width is less than the first width.

From reading the present disclosure, other variations and modifications will be apparent to the skilled person. Such variations and modifications may involve equivalent and other features which are already known in the art of semiconductor packaging, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

What is claimed is:

1. A packaged semiconductor device, comprising:
   a semiconductor die having a top major surface with a plurality of contact pads thereon, and four sides, wherein the sides are stepped such that a lower portion of each side extends laterally beyond a respective upper portion;
   encapsulating material encapsulating the top major surface and the upper portion of each of the sides wherein the semiconductor die is exposed at the lower portion of each of the sides, wherein the encapsulating material directly contacts the top major surface of the semiconductor die;
   a contact-redistribution structure formed directly on the encapsulating material over the top major surface of the semiconductor die;
   a plurality of metallic studs extending through the encapsulating material, and providing electrical contact between the plurality of contact pads and the contact-redistribution structure; and
   a plurality of contact balls affixed on the contact-redistribution structure, and at least some of which in electrical contact with one or more of the contact pads through the contact-redistribution structure.

2. The packaged semiconductor device of claim 1, wherein the contact-redistribution structure extends laterally beyond the semiconductor die.

3. The packaged semiconductor device of claim 1, wherein the plurality of contact balls is arranged such that at least one of the contact balls is positioned laterally further from a centre of the semiconductor die than a respective contact pad to which it is electrically connected.

4. The packaged semiconductor device of claim 1, wherein at least one contact ball is positioned laterally beyond the semiconductor die.

5. The packaged semiconductor device of claim 1, wherein a depth of the encapsulating material between the contact-redistribution structure and an interface with the exposed semiconductor die is within a range between 50% and 90% of a depth of the packaged semiconductor device.

6. The packaged semiconductor device of claim 1, wherein the lower portion of each side of the semiconductor die extends laterally beyond the respective upper portion by a distance which is within a range between 10 μm and 20 μm.

7. The packaged semiconductor device of claim 1, wherein the plurality of metallic studs comprise copper.

8. The packaged semiconductor device of claim 1, wherein the encapsulating material is a moulding compound.

9. A packaged semiconductor device, comprising:
   a semiconductor die having a top major surface with a plurality of contact pads thereon, and four sides, wherein the sides are stepped such that a lower portion of each side extends laterally beyond a respective upper portion;

encapsulating material encapsulating the top major surface and the upper portion of each of the sides, wherein the encapsulating material directly contacts the top major surface of the semiconductor die;

a contact-redistribution structure formed directly on the encapsulating material over the top major surface of the semiconductor die;

a plurality of metallic studs extending through the encapsulating material, and configured to provide electrical contact between the plurality of contact pads and the contact-redistribution structure; and a plurality of contact balls affixed on the contact-redistribution structure, the plurality of contact balls arranged such that at least one of the contact balls is positioned laterally further from a centre of the semiconductor die than a respective contact pad to which it is electrically connected.

10. The packaged semiconductor device of claim 9, wherein the contact-redistribution structure extends laterally beyond the semiconductor die.

11. The packaged semiconductor device of claim 9, wherein at least one contact ball is positioned laterally beyond the semiconductor die.

* * * * *